United States Patent [19]
Hiroshi

[11] Patent Number: 5,472,509
[45] Date of Patent: Dec. 5, 1995

[54] GAS PLASMA APPARATUS WITH MOVABLE FILM LINERS

[75] Inventor: Nomura Hiroshi, Shorewood, Minn.

[73] Assignee: NeoMecs Incorporated, St. Louis Park, Minn.

[21] Appl. No.: 159,870

[22] Filed: Nov. 30, 1993

[51] Int. Cl.$^6$ .................................................... C23C 16/00
[52] U.S. Cl. ................ 118/723 E; 156/345; 204/298.11; 204/298.24; 118/718; 118/719
[58] Field of Search ..................... 156/345, 643; 118/723 I, 723 MP, 733, 719, 718, 723 E; 204/298.11, 298.25, 298.35, 298.24

[56] References Cited

U.S. PATENT DOCUMENTS

| | | | |
|---|---|---|---|
| 1,758,531 | 5/1930 | Pfanhauser | 204/298.24 |
| 3,627,663 | 12/1971 | Davidse | 204/298.24 |
| 4,137,142 | 1/1979 | Vertegaal | 204/298.24 |
| 4,323,030 | 4/1982 | Lehmann, Jr. | 118/309 |
| 4,402,279 | 9/1983 | Witte et al. | 118/326 |
| 4,713,107 | 12/1987 | Yoshida et al. | 65/157 |
| 5,151,303 | 9/1992 | Hales | 118/719 |
| 5,152,839 | 10/1992 | Boyce et al. | 118/309 |
| 5,180,434 | 1/1993 | DiDio | 118/718 |
| 5,203,924 | 4/1993 | Mitani | 118/719 |
| 5,266,116 | 11/1993 | Fujioka | 118/719 |
| 5,277,751 | 1/1994 | Ogle | 118/723 I |
| 5,304,279 | 4/1994 | Coultas | 118/723 I |
| 5,324,362 | 6/1994 | Schneider | 118/723 MP |
| 5,364,481 | 11/1994 | Sasaki | 118/718 |

FOREIGN PATENT DOCUMENTS

| | | | |
|---|---|---|---|
| 2693620 | 1/1994 | France . | |
| 63-246814 | 10/1988 | Japan | H01L 21/205 |
| 2-175878 | 7/1990 | Japan . | |

OTHER PUBLICATIONS

Dynamic Debris Removal in High Power Electron Beam Personalization, IBM Technical Disclosure Bulletin, vol. 33, No. 12, May 1991.

Primary Examiner—R. Bruce Breneman
Assistant Examiner—Joni Y. Chang
Attorney, Agent, or Firm—Robert J. Petersen

[57] ABSTRACT

An apparatus for the treatment of articles with a polymerizate-producing gas plasma is disclosed wherein a set of movable film liners is used to shield the walls of a gas-plasma-containing reaction tunnel from excessive build-up of polymerizate deposits. In an operation involving continuous gas plasma coating of a film, fiber, fabric, tubing or string of workpieces, at least 75 to 90 percent of potential wall deposits are removable by the set of film liners.

14 Claims, 4 Drawing Sheets

GAS PLASMA APPARATUS WITH MOVABLE FILM LINERS

FIELD OF THE INVENTION

The present invention relates to an apparatus for conducting a gas plasma treatment of articles. More particularly, the present invention relates to an improved apparatus having movable protective liners for preventing deposits of plasma polymerizate from forming on reactor walls.

BACKGROUND OF THE INVENTION

Gas plasmas formed by glow discharge techniques in evacuated vessels have been used to modify the surfaces of various materials, including plastics, metals and ceramics. In particular, gas plasmas have been useful for depositing coatings such as organic polymers onto surfaces of workpieces such as films, fibers, prosthetic devices and so forth. A workpiece is positioned in a reaction vessel. The vessel is evacuated. A reactive gas or a mixture containing one or more reactive gases is then introduced at a pressure of 0.01 to 10 torr and excited to a plasma state, whereupon it modifies the surface of the workpiece. When the reactive gas or gas mixture contains a monomer or mixture of monomers that can form polymerizates from contact of the gas plasma with a surface, the surface will be coated with polymerizate deposits. Because of the nature of gas plasmas, coatings are also deposited on all other incidental surfaces in the reaction vessel, including vessel walls, any electrodes in the vessel, workpiece mounts, and the like. Electrodes placed within the reaction vessel are particularly prone to build-up of deposits. Furthermore, flaking of polymerizate deposits from metallic surfaces is commonly encountered because of poor adhesion of such deposits to metals, and this problem is pronounced with metallic electrodes.

As these deposits often build up quickly, especially in any continuous treatment process such as would be sought in the commercial use of this treatment technique, various difficulties have resulted. These include formation of loose flakes and debris that spall from thick coatings, opacification of window ports, and carryover of unwanted chemical elements to subsequent plasma coating operations. For example, treatment of a workpiece with a fluorinated monomer gas plasma, followed by treatment of a second workpiece with a nonfluorinated monomer gas plasma can result in contamination of the second workpiece with fluorine-containing species ablated from wall deposits. Wall deposits also undergo shrinkage due to continued exposure to gas plasmas. Because these deposits are exceptionally adherent to wall surfaces, shrinkage forces are transmitted to the walls. These forces have been known to cause crack formation in the walls with attendant vacuum loss, especially when the walls are made of transparent materials such as glass or synthetic quartz.

Japanese patent no. 63-246814 describes an apparatus wherein a film is guided around the inner wall of a cylindrical reaction vessel during gas plasma coating operations. The film feed roller and take-up rollers are mounted within the reaction vessel, as well as film guides along the film path. This design does not solve the problems of debris formation and cross-contamination, in that deposits would still build up on the electrode surfaces, the exposed guides and the rollers. An apparatus is needed that inherently eliminates the build up of unwanted plasma deposits at any point in the gas plasma treatment zone. Such an apparatus is needed in order to achieve the promise of continuous processing of articles by this technique.

SUMMARY OF THE INVENTION

An apparatus has now been discovered and developed that meets the heretofore unmet requirements for a gas plasma reaction vessel free of surfaces that experience excessive deposit build-up, thus avoiding flake and debris formation, and cross-contamination. This apparatus comprises a reaction tunnel connected at each end to a vacuum chamber, where, in the reaction tunnel, a set of moving film liners collectively shield the exposed tunnel walls from plasma deposit formation. The moving film liners connect to feed and take-up rolls mounted beyond the normal reach of the gas plasma zone in the reaction tunnel. The tunnel walls themselves serve a dual function, acting as film guides as well as containment walls. Each member of the set of the films is passed through the reaction tunnel, preferably under a controlled tension so as to control its positioning relative to one of the tunnel walls. The set of moving film liners serve to outline a gas plasma reaction zone through which the continuous treatment of a film, fiber, cloth, web, or conveyor line of workpieces can be passed without risk of cross-contamination or debris contamination. As will become obvious in the detailed description of this apparatus, this arrangement in its most preferred embodiment results in a gas plasma treatment zone that is essentially devoid of any surfaces other than the moving film liners and the workpiece.

DESCRIPTION OF THE EMBODIMENTS

Figure 1:
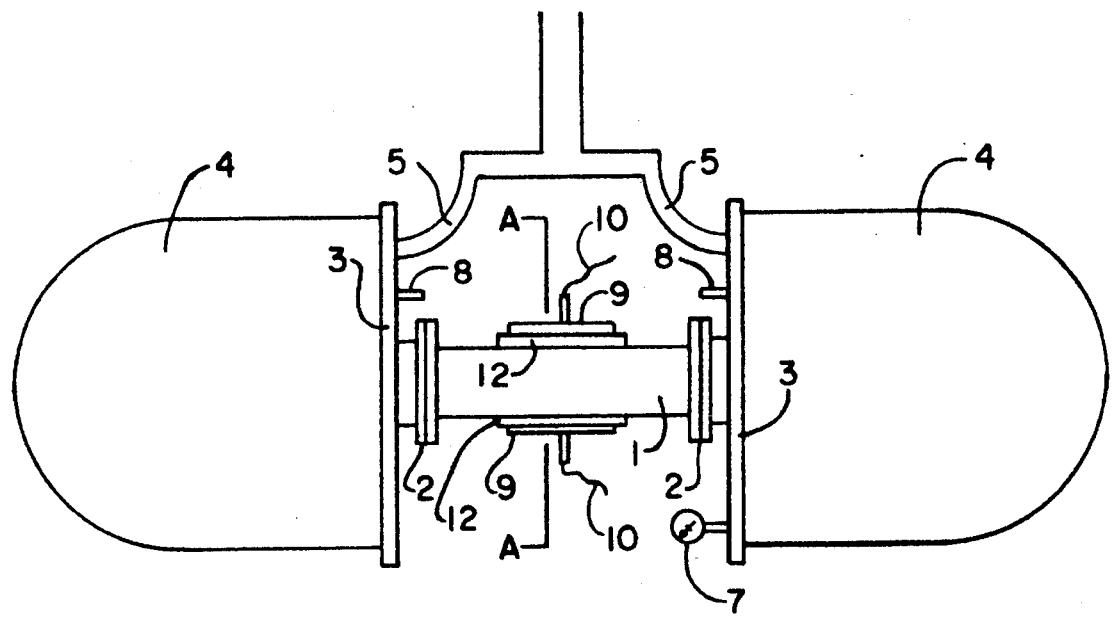
FIG. 1 is an overall external view of a system suitable for gas plasma treatment of articles.

FIG. 1 contains a schematic diagram showing an overall external view of a system in which the invention resides. This system, representing only one of many such designs that may be employed, has been found to be particularly advantageous in the continuous treatment of articles such as films, fibers, cloth, tubing, conveyor lines of workpieces, webs and the like. In FIG. 1, a reaction tunnel 1 is connected at each end by means of flange joints 2 to a pair of bell chambers having base plates 3 and movable bell housings 4. The bell housings 4 seal to the base plates 3 when the chambers are evacuated, but may otherwise be moved away for access to system components and workpieces in the chamber interiors. Provision is made for evacuating the system by means of vacuum ports 5 located on each of the base plates. The vacuum ports 5 are connected to a vacuum source (not shown) by means of a line that contains a valve 6 which is controlled by a pressure sensing monitor 7 so as to maintain system pressure at a level consistent with gas plasma treatment, i.e., normally in the range of 0.01 to 2 torr. Though not shown here, vacuum ports may also be individually equipped with on-off valves to allow evacuation through one bell chamber selectively rather than both bell chambers simultaneously. A reactive gas, a mixture of reactive gases, or a mixture of reactive and nonreactive gases is fed through one or more inlet ports 8. Glow discharge electrodes 9 having electrical leads 10 extending therefrom are externally mounted to the reaction tunnel 1. During plasma treatment, the system is evacuated, reactive gas is fed to the system to a desired pressure level, glow discharge electrodes 9 are electrically activated to produce a gas plasma in the reaction tunnel 1, and the article to be treated is fed through the reaction tunnel from one bell chamber to the other. Though depicted as bell-shaped in FIG. 1, the bell housings 4 may be otherwise shaped, with appropriate configuring of the base plate for assembly and sealing purposes. Oftentimes, the base plates 3 are fixed to a track by means of permanent mountings, and the bell housings 4 are mounted to movable brackets that slide on the track. This allows the bell housings 4 to be easily moved away from the base plates 3 for access to system components and workpieces located inside the bell chambers. It is generally advantageous for system components located inside the bell chambers to be mounted to the base plates 3 rather than the movable bell housings 4. The mounting may be made directly to the base plate or indirectly made by means of a frame or scaffold anchored to the base plate.

Figure 2:
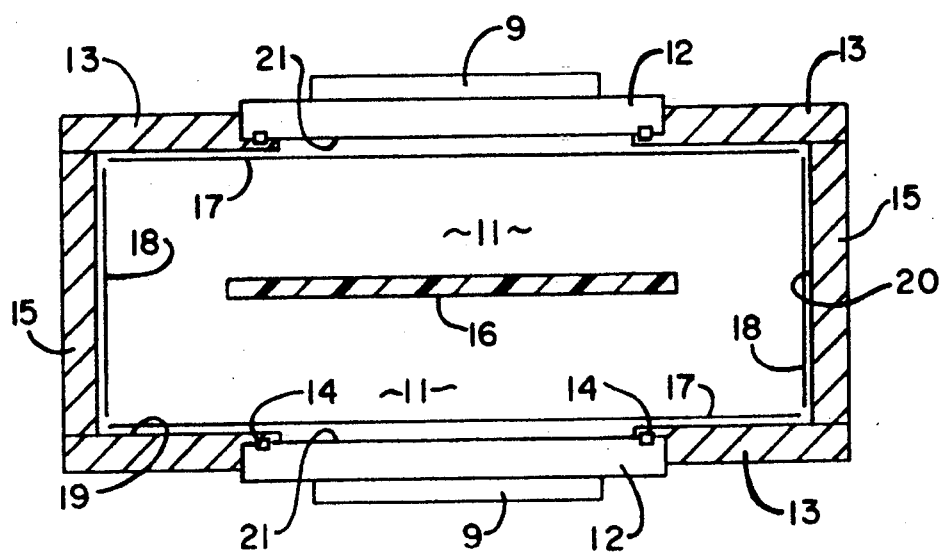
FIG. 2 is a view of a cross-section, corresponding to A—A of FIG. 1, of a reaction tunnel.

FIG. 2 shows a cross-section of a reaction tunnel at a point corresponding to A—A in FIG. 1. A zone 11 of excited gases (the gas plasma) is formed in conjunction with a pair of electrodes 9 mounted upon plates 12. These plates are normally composed of glass or synthetic quartz, for reasons of transparency, rigidity and electrical nonconductivity. The plates 12 are maintained in sealed contact with a first pair of tunnel walls 13 by means of O-ring or gasket seals 14. A second pair of tunnel walls 15 complete the formation of a tunnel cross-section. The article to be treated 16 is caused to travel through the zone 11 of the gas plasma. Moving film liners 17,18 which are the subject of this invention, are shown to be located in close proximity to the inner surfaces 19,20 of the tunnel walls 13,15, thereby shielding the surfaces 19,20 of the walls 13,15 from gas plasma polymerizate deposits. The plates 12 may be mounted so as to have inner surfaces 21 flush with the inner surfaces 19 of the first pair of tunnel walls 13, but this is not necessarily required for protection of the plate inner surfaces 21. If the distance between the plate inner surfaces 21 and the moving film liners 17 is less than 3 mm, more preferably less than 2 mm, little or no gas plasma tends to form between the moving film liners and these surfaces. Effective gas plasma development by glow discharge techniques appears to require a certain minimum mean free path free of energy-absorbing surfaces in order to fully develop. A rectangular cross-section has been shown for the reaction tunnel in FIG. 2. However, the cross-section may be shaped in the form of essentially any polygon, including for example triangular, square, rectangular, hexagonal, octagonal, trapezoidal, and parallelogramtalc shapes. For most purposes, a rectangular cross-section is preferred. Overall, the cross-sectional polygon is preferably defined by a set of essentially flat walls 13,15, so that the moving film liners 17,18 each of which may be effectively held in an essentially planar configuration by tension forces while traveling from its feed roll through the reaction tunnel to its take-up roll, will effectively align to and shield the walls 13,15 from gas plasma deposition. As shown in FIGS. 1 and 2, a horizontally arranged reaction tunnel is contemplated in a preferred embodiment, but the axis of the reaction tunnel can also be aligned to vertical or to any angle between horizontal and vertical. In a horizontal arrangement, tension might be applied to the moving film liners to prevent potential sagging by one or more of these film liners in the reaction zone. In a vertical arrangement, gravitational forces may be sufficient such that no film tension is desirable.

Figure 3:
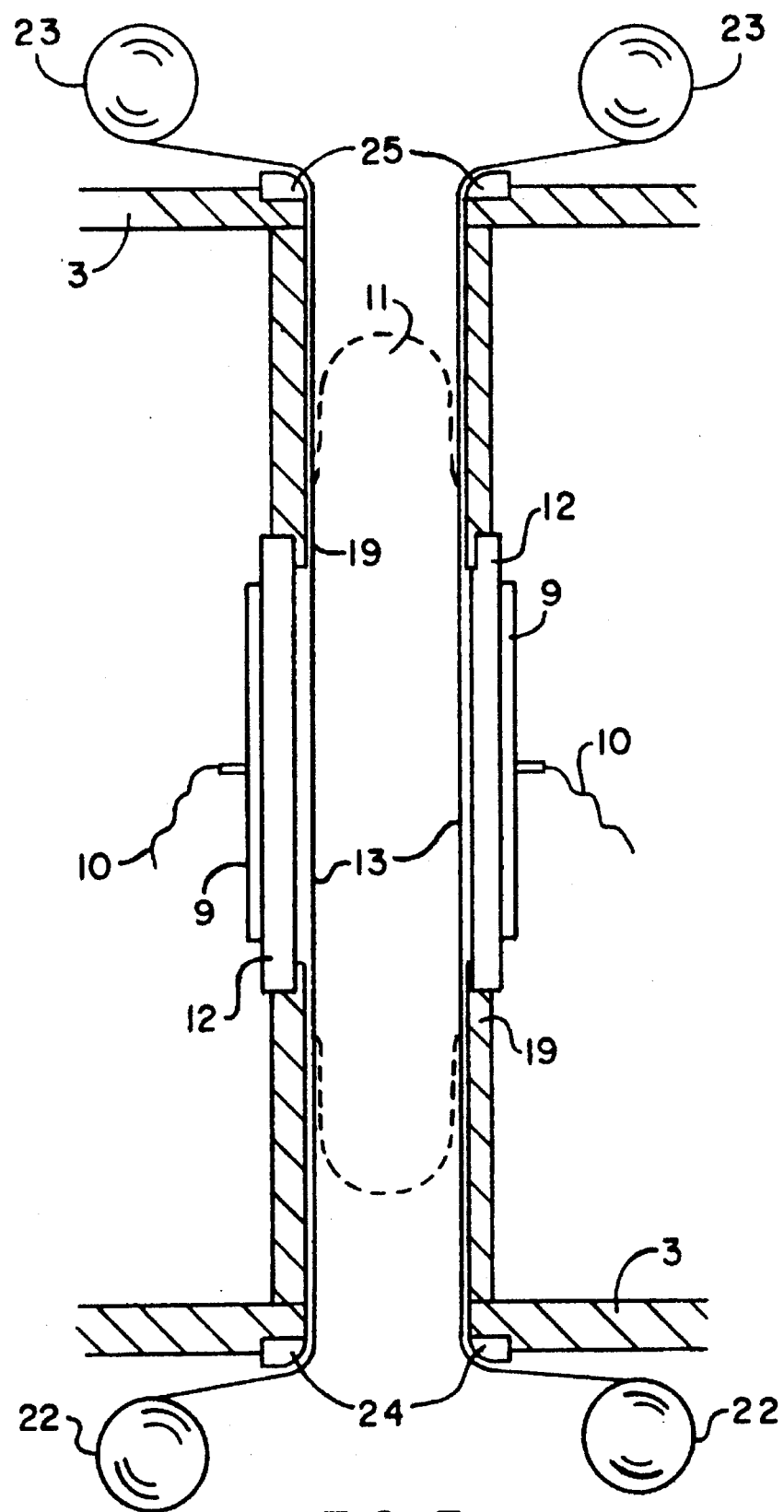
FIG. 3 is a side view of the path of a pair of moving film liners through a reaction tunnel.

FIG. 3 shows a side view of a cross-section of a reaction tunnel, showing how movable film liners might be advantageously fed through the gas plasma reaction zone. Rolls 22 of the movable film liners 13, suitably mounted and located outside of one end of a reaction tunnel are fed through the reaction tunnel under tension to take-up rolls 23 suitably mounted and located outside the opposite end of the same reaction tunnel. Each of the movable film liners 13 makes contact with a lip 24 mounted on a base plate 3 at an entrance opening to the reaction tunnel, which generally positions the path of the film liner 13 into parallel spatial relationship to an inner wall surface 19 of the tunnel. Similarly, the same individual film member preferably makes contact with a lip 25 of the exit opening at the opposite end of the tunnel, thereby further determining the position of the film liner in relationship to the inner wall surface 19. The number of such film liners is preferably equal to the number of walls defining the tunnel cross-section, only two walls being shown in FIG. 3 for sake of clarity. While other means or arrangements might be considered for introducing the movable film liners into the reaction tunnel, the arrangement depicted in FIG. 3 appears to be particularly advantageous. For instance, the cross-section of the reaction tunnel might be purposely varied or widened at points such as in the region of the connection of the flange 2 to the base plate 3 as in FIG. 1, but the geometry of the openings defined by the entrance and exit lips 24,25 would normally simulate the cross-sectional geometry of the reaction tunnel 1 in the region of the zone 11 of gas plasma.

Figure 4:
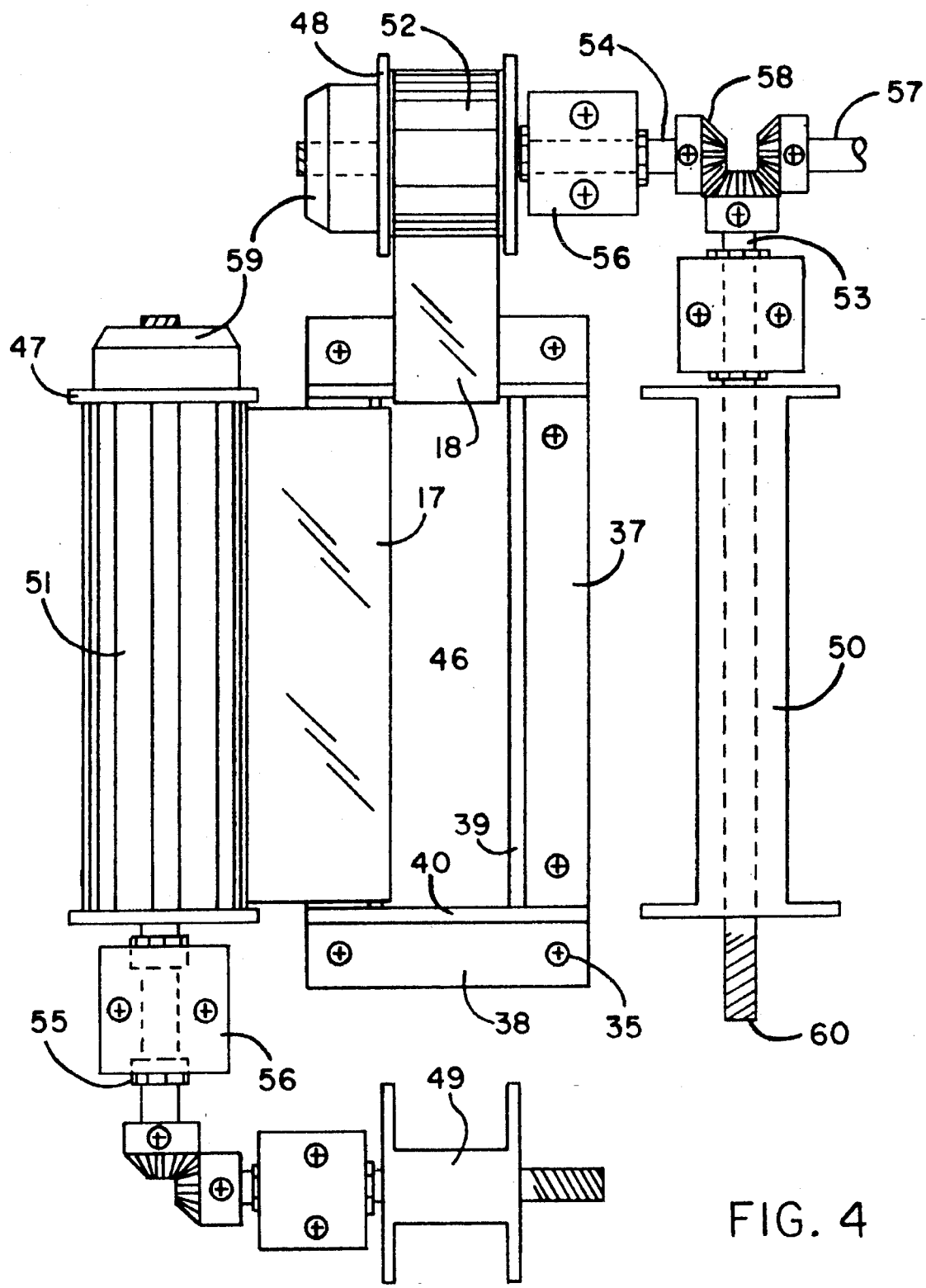
FIG. 4 is a view of a set of feed rolls of film liners mounted at a tunnel entrance.

Turning now to an example of a suitable arrangement of film liner feed rolls, FIG. 4 shows a view of a set of four feed rolls of film liners mounted at an entrance to a rectangularly shaped reaction tunnel. For purposes of explanation, two spools 26,27 are shown feeding rolls 30,31 of film liners 17,18 into the entrance of the rectangular reaction tunnel, and two spools 28,29 are shown without rolls of film. During gas plasma treatment all four spools 26–29 would normally be feeding rolls of film liner into the tunnel. Spools 26–29 are mounted on and rotate upon fixed shafts 32,33 which are in turn mounted to a base plate of a bell chamber by means of shaft mountings 34 fixed to a base plate by screws 35 or by other means. Film liners 17,18 are unrolled from the spools 26,27 and fed into a base plate entrance opening 36 that leads into the reaction tunnel. The entrance opening 36 may be simply a slot in the base plate or may be defined by lip plates 37,38 having radiused and polished lips 39,40 as shown here. It is generally preferable to match the dimensions of the entrance and exit openings with the dimensions of the reaction tunnel cross-section along its length in the region of the gas plasma zone. Alignment of the spools to the entrance opening may be accomplished by several means, such as by shims 41. Mounted onto exposed threaded ends 42,43 of the fixed shafts are tensioners 44, that is, fittings that apply friction to the movement of the spools 26–29. Frictional resistance to movement may be accomplished as for example by a spring-loaded stylus 45 or a plurality of the same.

Figure 5:
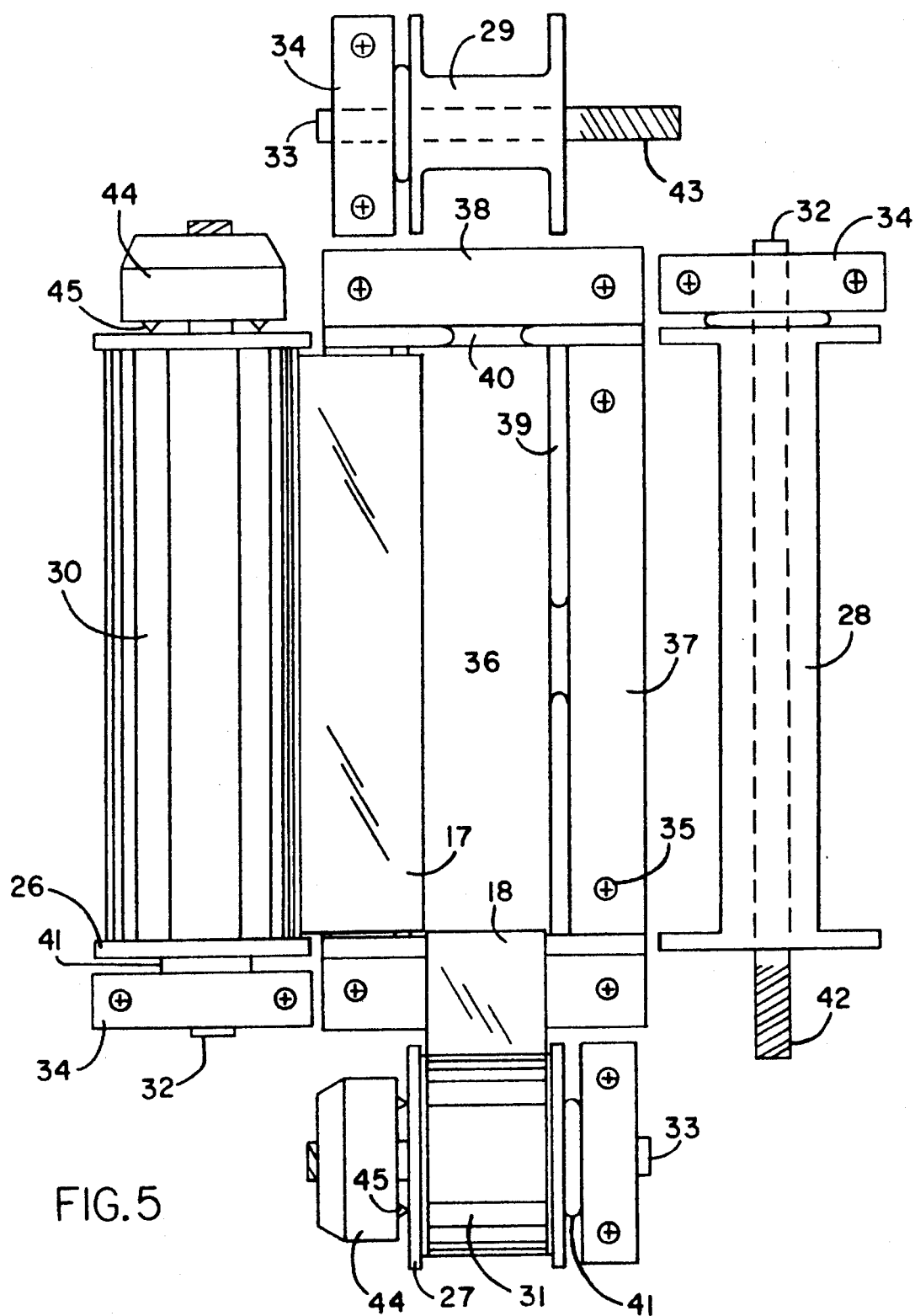
FIG. 5 is a view of a set of take-up rollers for film liners mounted at a tunnel exit.

FIG. 5 shows a view of a set of take-up rolls for film liners that would have passed through a gas plasma reaction tunnel. As shown in this case for a rectangularly shaped reaction tunnel, these would be suitably arranged around a rectangular exit opening 46 from the reaction tunnel. Again, for purposes of explanation two take-up spools 47,48 are shown winding up film liners 17,18 onto rolls 51,52, and two take-up spools 49,50 are shown empty, though all four would normally be in use during a gas plasma treatment operation in a rectangular reaction tunnel. Take-up spools 47–50 are mounted on and fixed to rotatable shafts 53,54. The rotatable shafts 53,54 are located relative to the exit opening 46 of the reaction tunnel by means of bearings 55 located in mounting blocks 56 that are anchored to a base plate as for example by screws 35. The rotatable shafts 53,54 are coupled to a drive source through a drive shaft 57. Coupling to a drive source may be direct or may, for example, employ miter gears 58 as shown herein. Mechanisms such as miter gears 58 can be advantageous in allowing simultaneous drive of two or more spools by a single drive shaft 57. Spool nuts 59 are placed on the exposed threaded ends 60,61 of the rotatable shafts 53,54 to position the spools 47–50 in place. The drive source may be located within the evacuated chamber wherein the spools 47–50 are emplaced or may be located externally to the gas plasma treatment apparatus, having a drive shaft penetrating into the evacuated chamber through a properly gasketed opening in a base plate. As was shown for the entrance opening 36 in FIG. 4, the exit opening 46 may be defined by a set of lip plates 37,38 having radiused and polished edges 39,40, or the exit opening 46 may consist of simply a slot in the base plate.

The drive source may employ a continuous movement or a pulsed movement drive. The speed of the drive may be appropriately changed by electronic control to compensate for changing roll diameter on the spool, so as to maintain a constant linear speed of the liner film through the reaction tunnel. The linear speed to be employed for the moving film liners will vary depending upon the nature of the gas plasma treatment being conducted, but will generally be in the range of 0.1 to 100 cm per hour, preferably 1 to 25 cm per hour. The liner film is preferably composed of flexible plastic material such as polyethylene terephthalate, polypropylene, polyethylene, polycarbonate or the like. Particularly preferable is polyethylene terephthalate film for its combination of heat resistance, high tensile strength and low cost. Film thickness may be chosen from a wide range as long as the film remains sufficiently flexible on one hand and sufficiently strong on the other hand. A thickness of about 7.5 micrometers has been found to be particularly convenient in the case of polyethylene terephthalate. The direction of movement of the film liners may be either co-current with or countercurrent to the movement of a film, fiber, tube or other workpiece through the reaction tunnel. It is believed that counter-current movement would be generally preferable to co-current movement.

Two types of glow discharge generating frequencies are particularly useful for gas plasma polymerizations, these being radio frequency (RF) and audio frequency (AF). RF electrodes can be mounted either inside a reaction tunnel or exteriorly to the reaction tunnel. It is generally preferable that they be mounted exteriorly to the reaction tunnel. In contrast to RF electrodes, AF electrodes are almost always mounted inside a reaction tunnel, in that audio signals are poorly transmitted to low pressure gases through tunnel walls. The design shown in FIGS. 2 and 3 would be generally applicable to the use of RF electrodes. Use of externally mounted RF electrodes customarily require electrode mounting plates that are transparent to RF signals. Quartz and high silica glasses are normally used in this regard, having added advantages of strength and transparency to visible light for visual observation. However, RF electrodes may in some cases be preferably mounted inside a reaction tunnel, depending upon the nature of the gas plasma polymerization to be generated. In such a case, RF transparency is not particularly advantageous, and a broader selection of compositions for the plates can readily be considered. If the electrodes are electrically insulated from the surfaces upon which they are mounted, they may even be mounted onto metal plates. Alternatively, they may be mounted directly on inner surfaces of the reaction tunnel walls. However, for convenience of access and operational versatility, use of mounting plates is generally preferred for both RF and AF electrodes. In a gas plasma treatment apparatus designed for commercial processing of a variety of articles, versatility through possible changeover of electrodes and their mountings may be a particularly important and useful feature. Generally a pair of electrodes are used in generating gas plasmas, but in some instances only a single electrode might be employed. The description provided above and in the Figures is not meant to limit the number of electrodes to two.

In the most preferred embodiment of the invention, the number of movable film liners will be equal to the number of walls of the gas plasma reaction tunnel, and the path of each individual film liner will be parallel to and in close proximity to an individual wall along its length in the gas plasma zone. By close proximity is meant that the film liner is within at least 3 mm of the wall inner surface, more preferably within at least 2 mm, most preferably within at least 1 mm of the wall inner surface. The film liners may even be in sliding contact each with its specific wall, or with other surfaces such as of mounting plates or internally mounted electrodes within the reaction tunnel. The walls need not be perfectly flat on their inner surfaces and the paths of the film liners need not be perfectly planar for the purposes of this invention to be realized in practice. Nor need the protective coverage of the walls from deposition of gas plasma polymerizates be perfect to achieve a useful result. Preferably at least 75%, more preferably at least 90%, most preferably at least 95% of the wall inner surfaces in the zone of the gas plasma should be protected from significant plasma polymerizate deposition.

The first and second vacuum chambers may be connected to one another other than solely through the reaction tunnel. They may be in communication with one another through commonly shared ports, or even, for example, by means of an opening in a commonly shared wall. They may in combination with one another act as a single overall vacuum chamber. The size, shape and arrangement of the vacuum chambers is secondary to the spirit and scope of the invention which centers on the arrangement and means of moving a set of film liners through a gas plasma reaction tunnel.

The above description and drawings of the invention have been given by way of example. Obviously, the invention may be embodied in other derivations and variations without departing from the spirit and the scope of the invention as described herein. This description has been made in an illustrative manner, and it is to be understood that the terminology employed herein has been made for purposes of description, and the nature of the words is not meant to be unduly limiting. Accordingly, other embodiments of the invention may be practiced and are considered to be within the claims which follow.

I claim:

1. An apparatus for gas plasma treatment of articles, comprising: a reaction tunnel having a first and a second end, the first end connected to a first vacuum chamber and the second end connected to a second vacuum chamber, an electrode means mounted on the reaction tunnel for producing a gas plasma within the reaction tunnel, a plurality of movable film liners extending through the reaction tunnel from a set of feed rolls positioned in the first vacuum chamber to a set of take-up rolls positioned in the second vacuum chamber, each of the movable film liners following a path in close proximity to an inner surface of the reaction tunnel, the plurality of the movable liner films collectively shielding all inner surfaces of the reaction tunnel wherein a gas plasma is to be produced, a means for driving the take-up rolls, and a means for conducting through the reaction tunnel an article to be treated by a gas plasma.

2. The apparatus according to claim 1 wherein the reaction tunnel has a plurality of walls, the walls defining a tunnel cross-section having the shape of a polygon.

3. The apparatus according to claim 2 wherein the shape of the polygon is a member of the group consisting of a triangle, a square, a rectangle, a trapezoid, a parallelogram, a pentagon, a hexagon, and an octagon.

4. The apparatus according to claim 3 wherein the plurality of movable liner films is equal numerically to the plurality of walls of the reaction tunnel.

5. The apparatus according to claim 1 wherein the movable liner films are selected from a group consisting of polyethylene terephthalate, polycarbonate, polypropylene, polyethylene, aliphatic polyamide, aromatic polyamide and polytetrafluoroethylene.

6. The apparatus according to claim 5 wherein a means is provided for applying a tension to at least one of the movable film liners.

7. The apparatus according to claim 1 wherein the electrode means comprises at least one radiofrequency electrode mounted exteriorly to the reaction tunnel upon a radiofrequency-transparent plate.

8. The apparatus according to claim 1 wherein the first and second vacuum chambers are additionally in communication with each other through a commonly shared opening.

9. An apparatus for gas plasma treatment of articles, comprising:

a) a reaction tunnel having a first and a second end, b) a first base plate of a first bell chamber connected to the first end of the reaction tunnel, the first base plate having a plurality of feed rolls of movable film liners mounted thereto around an entrance opening through the base plate into the reaction tunnel, c) a second base plate of a second bell chamber connected to the second end of the reaction tunnel, the second base plate having a plurality of take-up rolls for the movable film liners mounted thereto around an exit opening from the reaction tunnel through the base plate, d) a plurality of movable liner films extending through the reaction tunnel, each movable film liner extending from an individual member of the plurality of feed rolls to an individual member of the plurality of take-up rolls, e) a means for applying resistance to unwinding of each member of the plurality of feed rolls, f) a means for driving each member of the plurality of the take-up rolls, whereby each of the movable liner films can be pulled under tension through the reaction tunnel, each of the movable liner films following a path in close proximity to an inner surface of the reaction tunnel, the plurality of the movable liner films collectively shielding all inner surfaces of the reaction tunnel wherein a gas plasma is to be produced, and g) a means for conveying through the reaction tunnel an article to be treated by a gas plasma.

10. The apparatus according to claim 9 wherein the reaction tunnel has a plurality of walls, the walls defining a tunnel cross-section having the shape of a polygon.

11. The apparatus according to claim 10 wherein the shape of the polygon is a member of the group consisting of a triangle, a square, a rectangle, a trapezoid, a parallelogram, a pentagon, a hexagon, and an octagon.

12. The apparatus according to claim 11 wherein the plurality of movable liner films is equal numerically to the plurality of walls of the reaction tunnel.

13. The apparatus according to claim 9 wherein the electrode means comprises at least one radiofrequency electrode mounted exteriorly to the reaction tunnel upon a radiofrequency-transparent plate.

14. The apparatus according to claim 9 wherein the movable film liners are selected from a group consisting of polyethylene, polypropylene, polyethylene terephthalate, polycarbonate, aliphatic polyamide, aromatic polyamide, and polytetrafluoroethylene.

\* \* \* \* \*

UNITED STATES PATENT AND TRADEMARK OFFICE
CERTIFICATE OF CORRECTION

PATENT NO. : 5,472,509
DATED : December 5, 1995
INVENTOR(S) : Hiroshi Nomura

It is certified that error appears in the above-indentified patent and that said Letters Patent is hereby corrected as shown below:

On the title page, item [19] "Hiroshi" should read --Nomura-- item [75] "Nomura Hiroshi" should read --Hiroshi Nomura--

Signed and Sealed this

Twenty-third Day of April, 1996

*Attest:*

BRUCE LEHMAN

*Attesting Officer*       Commissioner of Patents and Trademarks